(12) United States Patent
Kamimura

(10) Patent No.: US 9,048,195 B2
(45) Date of Patent: Jun. 2, 2015

(54) POLISHING FLUID AND POLISHING METHOD

(75) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 147 days.

(21) Appl. No.: 13/192,982

(22) Filed: Jul. 28, 2011

(65) Prior Publication Data
US 2012/0028467 A1    Feb. 2, 2012

(30) Foreign Application Priority Data

Jul. 29, 2010  (JP) ................................ 2010-171074

(51) Int. Cl.
| | | |
|---|---|---|
| C09K 13/04 | (2006.01) | |
| H01L 21/3105 | (2006.01) | |
| C09G 1/02 | (2006.01) | |
| H01L 21/8234 | (2006.01) | |
| H01L 21/8238 | (2006.01) | |

(52) U.S. Cl.
CPC ............ *H01L 21/31053* (2013.01); *C09G 1/02* (2013.01); *H01L 21/823437* (2013.01); *H01L 21/823828* (2013.01)

(58) Field of Classification Search
USPC ................. 252/79.1, 79.2, 79.3, 79.4, 79.5; 438/692, 693, 691; 216/88, 89
See application file for complete search history.

(56) References Cited

U.S. PATENT DOCUMENTS

| | | | |
|---|---|---|---|
| 8,349,207 B2 * | 1/2013 | Matsumoto et al. ......... 252/79.4 |
| 2006/0234509 A1 * | 10/2006 | Small et al. .................. 438/692 |
| 2007/0004049 A1 | 1/2007 | Nasu et al. | |
| 2007/0298612 A1 | 12/2007 | Dysard et al. | |
| 2009/0081871 A1 * | 3/2009 | Dysard et al. ................. 438/693 |
| 2009/0215269 A1 * | 8/2009 | Boggs et al. .................. 438/693 |
| 2009/0267021 A1 | 10/2009 | Nakajo et al. | |
| 2009/0298290 A1 * | 12/2009 | Kamimura .................... 438/693 |
| 2010/0009538 A1 * | 1/2010 | Kamimura .................... 438/692 |
| 2010/0210184 A1 * | 8/2010 | Narita ............................. 451/36 |
| 2011/0198531 A1 | 8/2011 | Tanaka | |

FOREIGN PATENT DOCUMENTS

| | | |
|---|---|---|
| JP | 06-124932 A | 5/1994 |
| JP | 2007-012922 A | 1/2007 |
| JP | 2007-335847 A | 12/2007 |

(Continued)

OTHER PUBLICATIONS

Office Action dated Jan. 7, 2013 in Japanese Application No. 2010-171074.

*Primary Examiner* — Lan Vinh
(74) *Attorney, Agent, or Firm* — Sughrue Mion, PLLC

(57) ABSTRACT

Provided is a polishing fluid that has a fast polishing rate, and can selectively suppress polishing of layers including polysilicon or modified polysilicon during the chemical mechanical polishing in the manufacture of semiconductor integrated circuits, and a polishing method using the same. A polishing fluid used for the chemical mechanical polishing in which each of the components represented by the following (1) and (2) is included, the pH is 1.5 to 5.0, and a polishing workpiece can be polished in a range of a ratio represented by RR (other)/RR (p-Si) when the polishing rate of the first layer is RR (p-Si), and the polishing rate of the second layer is RR (other) of 1.5 to 200.

(1) Colloidal silica particles
(2) At least one inorganic phosphate compound selected from phosphoric acid, pyrophosphoric acid, and polyphosphoric acid.

15 Claims, 1 Drawing Sheet

(56) References Cited

FOREIGN PATENT DOCUMENTS

| | | |
|---|---|---|
| JP | 2009-263484 A | 11/2009 |
| JP | 2009-540575 A | 11/2009 |
| JP | 2009-289885 A | 12/2009 |
| JP | 2009-290126 A | 12/2009 |
| JP | 2010-041037 A | 2/2010 |
| WO | 2009/037903 A1 | 3/2009 |
| WO | 2010/047314 A1 | 4/2010 |

* cited by examiner

POLISHING FLUID AND POLISHING METHOD

BACKGROUND OF THE INVENTION

1. Field of the Invention

The present invention relates to a polishing fluid used in a step of manufacturing a semiconductor integrated circuit, and a polishing method using the same.

2. Description of the Related Art

Recently, there has been demand for an increase in density and an increase in integration by means of miniaturizing and laminating wirings in pursuit of size reduction and increased speed in the development of semiconductor devices represented by semiconductor integrated circuits (hereinafter, sometimes, referred to as "LSI"). A variety of techniques, such as chemical mechanical polishing (hereinafter, sometimes referred to as "CMP"), have been used as techniques for this pursuit. The CMP is an essential technique when carrying out the surface flattening of a film workpiece, such as an interlayer insulation film, plug formation, formation of embedded metal wirings, and the like, and the CMP carries out the flattening and the like of substrates.

In an ordinary method of the CMP, a polishing pad is attached to a round polishing platen, the surface of the polishing pad is soaked with a polishing fluid, the surface (surface to be polished) of a substrate (wafer) is pressed to the pad, and both the polishing platen and the substrate are rotated in a state in which a predetermined pressure (polishing pressure) is applied from the rear surface of the substrate, thereby flattening the surface of the substrate by mechanical friction generated.

In recent years, the CMP has been applied to each step in the manufacture of semiconductors, and an example of an aspect thereof includes an application to the gate forming step in the manufacture of transistors.

In this case, gates mainly made of modified polysilicon obtained by injecting impurities, such as B, to polysilicon have been manufactured for transistors in the related art, but ongoing studies are being carried out regarding the application of high-dielectric constant gate insulation films (high-k films) and metal gate electrodes, instead of polysilicon in the related art, to transistors of 45 nm-generation or later to satisfy both the reduction of power consumption during standby and high-current operation capabilities. Several methods have been suggested as technologies in which the above is applied. For example, a method in which a dummy gate insulation film and a dummy gate electrode are formed, a source drain diffusion layer is formed by injecting impurities to a polycrystalline silicon film in a self-aligning manner, the dummy gate insulation film and the dummy gate electrode are removed, and a high-dielectric constant gate insulation film and a metal gate electrode are then formed is suggested (for example, refer to JP2007-12922A).

In addition, several techniques have been suggested regarding the method of forming a metal gate electrode. A fully silicided gate (hereinafter, referred to as "FUSI gate") is one of the candidates thereof. The FUSI gate is formed by siliciding a gate electrode formed of polysilicon, similarly to the CMOS process in the related art, but the entire gate electrode is silicided in the FUSI while only the top portion of the gate electrode was silicided in the related art. The FUSI has a large merit in building processes in comparison to the method in which a metal gate electrode is formed by the damascene process since the know how of the CMOS process in the related art becomes useful.

In recent years, it has been suggested to selectively perform the CMP on polysilicon and the like and the second and the third materials that cover the periphery of the polysilicon when a gate is formed using the above polysilicon or modified polysilicon (hereinafter referred to simply and collectively as "polysilicon and the like") (for example, refer to JP-H06-124932A (JP1994-124932A) and JP2009-540575A). However, when a polishing workpiece including polysilicon and the like is polished by the CMP using a well-known polishing fluid in the related art, there is a problem in that polysilicon and the like which the manufacturer wants to remain as a gate material are excessively polished, which may, furthermore, cause performance degradation or the like of the obtained LSI.

For the purpose of solving the problems of the performance degradation and the like of an LSI, JP2009-290126A discloses a polishing fluid that is used for the chemical mechanical polishing of polishing workpieces which are configured to have at least a first layer including polysilicon or modified polysilicon, and a second layer including at least one selected from a group consisting of silicon oxide, silicon nitride, silicon carbide, silicon carbonitride, silicon oxycarbide, and silicon oxynitride; contains colloidal silica particles, an organic acid, and an anionic surfactant; has a pH of 1.5 to 7.0; and can selectively polish the second layer with respect to the first layer.

SUMMARY OF THE INVENTION

A certain degree of effect with respect to the problem of the performance degradation and the like of an LSI can be obtained by using the polishing fluid disclosed in JP2009-290126A, but there is demand for additional improvement of the effect.

Therefore, an object of the invention is to provide a polishing fluid that has a fast polishing rate, and can selectively suppress polishing of layers including polysilicon or modified polysilicon during the chemical mechanical polishing in the manufacture of semiconductor integrated circuits, and, furthermore, realizes high aging stability during the storage of the polishing fluid (properties of suppressing and preventing degradation over passage of time), and a polishing method using the same.

The detailed means for solving the above problems are as follows.

[1] A polishing fluid used for the chemical mechanical polishing of semiconductor substrates that are configured to have at least a first layer including polysilicon or modified polysilicon, and a second layer including at least one selected from a group consisting of silicon oxide, silicon nitride, silicon carbide, silicon carbonitride, silicon oxycarbide, and silicon oxynitride, in which each of the components represented by the following (1) and (2) is included, the pH is 1.5 to 5.0, and a polishing workpiece can be polished in a range of a ratio represented by RR (other)/RR (p-Si) when the polishing rate of the first layer is RR (p-Si), and the polishing rate of the second layer is RR (other) of 1.5 to 200.

(1) Colloidal silica particles (2) At least one inorganic phosphate compound selected from phosphoric acid, pyrophosphoric acid, and polyphosphoric acid.

[2] The polishing fluid according to [1] further including an anionic surfactant represented by the general formula (I) as a third component.

$$R^1-SO_3X \tag{I}$$

[In the general formula, 'R¹' represents alkyl groups, alkenyl groups, cycloalkyl groups, aryl groups, aralkyl groups, all of which have a carbon number of 6 to 30, and groups formed by combining 2 or more of the above groups. 'X' represents a hydrogen atom, lithium, sodium, potassium, an ammonium cation, and quaternary ammonium cations.]

[3] The polishing fluid according to [2] including at least one selected from a group consisting of compounds represented by the following general formula (II), general formula (III), general formula (IV), and general formula (V) instead of or together with the anion surfactant represented by the general formula (I) as the third component.

R¹—O—SO₃X  (II)

[In the general formula (III), 'R¹' represents alkyl groups, alkenyl groups, cycloalkyl groups, aryl groups, aralkyl grams, all of which have a carbon number of 6 to 30, or groups formed by combining 2 or more of the above groups. 'X' represents a hydrogen atom, sodium, potassium, an ammonium cation, quaternary ammonium cations, diethanolamine, or triethanolamine.]

R²—O—(CH₂CH₂O)ₙ—SO₃X  (III)

[In the general formula (III), 'R²' represents alkyl groups, alkenyl groups, cycloalkyl groups, aryl groups, aralkyl groups, all of which have a carbon number of 6 to 30, or groups formed by combining 2 or more of the above groups. 'n' represents an integer of 1 to 10. 'X' represents the same as in the general formula (II).]

GENERAL FORMULA (IV)

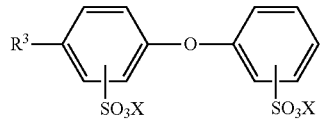

[In the general formula (IV), 'R³' represents alkyl groups, alkenyl groups, cycloalkyl groups, aryl groups, aralkyl groups, all of which have a carbon number of 6 to 30, or groups formed by combining 2 or more of the above groups, 'X' represents the same as in the general formula (II), and a plurality of Xs may be mutually the same or different.]

GENERAL FORMULA (V)

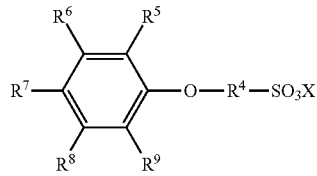

[In the general formula (V), 'R⁴' represents alkylene groups, alkynylene groups, cycloalkylene groups, arylene groups, alkylene oxide groups, all of which have a carbon number of 1 to 20, or groups formed by combining 2 or more of the above groups. 'R⁵ to R⁹' independently represent any of a hydrogen atom, a hydroxyl group, alkyl groups, alkenyl groups, cycloalkyl groups, aryl groups, aralkyl groups, sulfo groups, carboxyl groups, all of which have a carbon number of 1 to 30, and hydrocarbon groups including the above. 'X' represents the same as in the general formula (II).]

[4] The polishing fluid according to any of [1] to [3], in which the concentration of the colloidal silica particles is 0.1% by mass to 10% by mass with respect to the total mass of the polishing fluid.

[5] The polishing fluid according to any of [1] to [4], in which the average primary particle diameter of the colloidal silica particles is 5 nm to 100 nm, and the average secondary particle diameter is in a range of 10 nm to 300 nm.

[6] The polishing fluid according to any of [1] to [5], in which the colloidal silica particles have a negative ξ potential, and the ξ potential is −50 mV to −5 mV.

[7] The polishing fluid according to any of [1] to [6], in which the content of the inorganic phosphate compound is 0.001% by mass to 10% by mass.

[8] The polishing fluid according to any of [2] to [7], in which the concentration of the anionic surfactant is 0.001% by mass to 1% by mass with respect to the total mass of the polishing fluid.

[9] The polishing fluid according to any of [2] to [8], in which the anionic surfactant is a multivalent anionic surfactant.

[10] The polishing fluid according to any of [1] to [9], in which the electrical conductivity of the polishing fluid is in a range of 0.01 (mS/cm) to 12 (mS/cm).

[11] A method of manufacturing a semiconductor device, in which, each time the chemical mechanical polishing (CMP) method is carried out to polish the surface of a semiconductor substrate that is configured to have at least a first layer including polysilicon or modified polysilicon, and a second layer including at least one selected from a group consisting of silicon oxide, silicon nitride, silicon carbide, silicon carbonitride, silicon oxycarbide, and silicon oxynitride, a processing treatment including (a) a step in which a polishing fluid including each of the components of the following (1) and (2) and having a pH of 1.5 to 5.0 is prepared, (b) a step in which the polishing fluid is supplied to the surface of the semiconductor substrate, and a polishing pad is brought into contact with the surface of the semiconductor substrate, and (c) a step in which, each time the first layer and the second layer of the semiconductor substrate are polished, the polishing pad and the semiconductor substrate are relatively moved so that a polishing workpiece can be polished in a range of a ratio represented by RR (other)/RR (p-Si) when the polishing rate of the first layer is RR (p-Si), and the polishing rate of the second layer is RR (other) of 1.5 to 200 while the polishing pad is in continuous contact with the surface of the semiconductor substrate through the polishing fluid for a time sufficient enough to polish the second layer is carried out.

(1) Colloidal silica particles
(2) At least one inorganic phosphate compound selected from phosphoric acid, pyrophosphoric acid, and polyphosphoric acid.

[12] The method of manufacturing a semiconductor device according to [11] further including compounds selected from a group consisting of compounds represented by the general formulas (I) to (V) as a third component.

R¹—SO₃X  (I)

[In the general formula (I), 'R¹' represents alkyl groups, alkenyl groups, cycloalkyl groups, aryl groups, aralkyl groups, all of which have a carbon number of 6 to 30, and groups formed by combining 2 or more of the above groups. 'X' represents a hydrogen atom, lithium, sodium, potassium, an ammonium cation, and quaternary ammonium cations.]

R¹—O—SO₃X  (II)

[In the general formula (II), 'R¹' represents the same as the general formula (I). 'X' represents a hydrogen atom, sodium, potassium, an ammonium cation, quaternary ammonium cations, diethanolamine, or triethanolamine.]

$$R^2-O-(CH_2CH_2O)_n-SO_3X \quad (III)$$

[In the general formula (III), 'R²' represents alkyl groups, alkenyl groups, cycloalkyl groups, aryl groups, aralkyl groups, all of which have a carbon number of 6 to 30, or groups formed by combining 2 or more of the above groups. 'n' represents an integer of 1 to 10. 'X' represents the same as in the general formula (II).]

GENERAL FORMULA (IV)

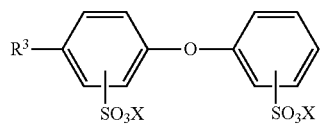
(IV)

[In the general formula (IV), 'R³' represents alkyl groups, alkenyl groups, cycloalkyl groups, aryl groups, aralkyl groups, all of which have a carbon number of 6 to 30, or groups formed by combining 2 or more of the above groups, 'X' represents the same as in the general formula (II), and a plurality of Xs may be mutually the same or different.]

GENERAL FORMULA (V)

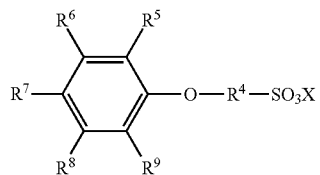
(V)

[In the general formula (V), 'R⁴' represents alkylene groups, alkynylene groups, cycloalkylene groups, arylene groups, alkylene oxide groups, all of which have a carbon number of 1 to 20, or groups formed by combining 2 or more of the above groups. 'R⁵ to R⁹' independently represent any of a hydrogen atom, a hydroxyl group, alkyl groups, alkenyl groups, cycloalkyl groups, aryl groups, aralkyl groups, sulfo groups, carboxyl groups, all of which have a carbon number of 1 to 30, and hydrocarbon groups including the above. 'X' represents the same as in the general formula (II).]

According to the invention, it is possible to provide a polishing fluid that has a fast polishing rate, and can selectively suppress polishing of layers including polysilicon or modified polysilicon during the chemical mechanical polishing in the manufacture of semiconductor integrated circuits, and, furthermore, realizes high aging stability while the polishing fluid is stored, and a polishing method using the same.

BRIEF DESCRIPTION OF THE DRAWINGS

FIG. 1 is a group of cross-sectional views showing a substrate as an embodiment to which the polishing fluid of the invention is applied, in which

DESCRIPTION OF THE PREFERRED EMBODIMENTS

Figure 1B:
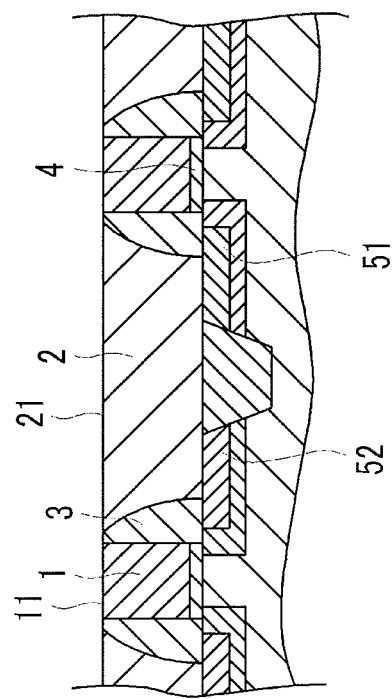
FIG. 1A shows a state before polishing and FIG. 1B shows a state after polishing.

Hereinafter, the polishing fluid of the invention contains a combination of colloidal silica particles, an inorganic phosphate compound, and a specific anionic surfactant according to necessity, and has a pH adjusted to a predetermined range. Thereby, it is possible to achieve superior polishing in the CMP step to the polishing fluids suggested in the related art, and, particularly, an excellent effect, by which the polishing rate of polysilicon or modified polysilicon can be selectively suppressed while rapid polishing is maintained across the entire workpiece, is exhibited. Hereinafter the invention will be described in detail based on preferred embodiments of the invention.

[Polishing Fluid]

The polishing fluid of the invention contains each of the following components, and the pH is 1.5 to 5.0.

(1) Colloidal silica particles (2) At least one inorganic phosphate compound selected from phosphoric acid, pyrophosphoric acid, and polyphosphoric acid.

The "polishing fluid" in the invention refers to not only polishing fluids used for polishing (that is, polishing fluids diluted according to necessity) but also the concentrated solutions of polishing fluids. The concentrated solutions or concentrated polishing fluids refer to polishing fluids in which the concentration of the solute is adjusted to higher than that of polishing fluids used for polishing, and polishing fluids that are diluted by water, an aqueous solution, or the like, and then used for polishing. The dilution is normally 1 time by volume to 20 times by volume. In the present specification, the terms "concentrated" and "concentrated solution" are used in accordance with the practical expression having a meaning of "denser" and "denser fluid" than in usage states, and used in a different manner from the general meaning of the terms which accompany physical concentration operations, such as vaporization. In addition, the compounds in the invention refer to not only compounds represented by the chemical equations and the like, but also the salts and ions thereof.

The polishing fluid of the invention is a polishing fluid that is preferably used when formation of a gate electrode is carried out by the CMP in a semiconductor integrated circuit, for which polysilicon or modified polysilicon is applied as an electrode material. More specifically, the polishing fluid of the invention can be used for the chemical mechanical polishing of a polishing workpiece that is configured to have at least a first layer including polysilicon or modified polysilicon, and a second layer including at least one selected from a group consisting of silicon oxide, silicon nitride, silicon carbide, silicon carbonitride, silicon oxycarbide, and silicon oxynitride during the flattening step in the manufacture of semiconductor integrated circuits.

The polishing fluid of the invention contains each of the components represented by (1) or (2), and has a pH of 1.5 to 5.0. Thereby, the second layer including at least one selected from a group consisting of silicon oxide, silicon nitride, silicon carbide, silicon carbonitride, silicon oxycarbide, and silicon oxynitride can be selectively polished with respect to the first layer including polysilicon or modified polysilicon.

With regard to the selective polishing of the second layer with respect to the first layer, the polishing fluid of the invention is preferably a polishing fluid that can polish a polishing workpiece in a range of a ratio represented by RR (other)/RR (p-Si) when the polishing rate of the first layer is RR (p-Si), and the polishing rate of the second layer is RR (other) of 1.5 to 200. The ratio represented by RR (other)/RR (p-Si) is preferably in a range of 3 to 10. When the ratio represented by RR (other)/RR (p-Si) is in the above range, undesired polishing with respect to the first layer can be suppressed, and the uneven separation of the first layer caused by an excessive stress applied to the film interface between the first layer and the base layer during polishing can also be suppressed effectively.

Therefore, the use of the polishing fluid of the invention can allow rapid polishing of layers including silicon-based materials other than polysilicon or modified polysilicon, for which rapid polishing is required, without excessively polishing a gate electrode when a gate electrode configured to include polysilicon or modified polysilicon is formed by the CMP in the manufacture of LSI.

[Colloidal Silica Particles]

The polishing fluid of the invention contains colloidal silica particles, which preferably exhibit a negative $\xi$ potential at the surfaces at least as a part of abrasive grains. The colloidal silica particles are not particularly limited, but are preferably colloidal silica particles exhibiting a negative $\xi$ potential at the surfaces by an anionic compound absorbed on the surfaces of the colloidal silica particles having positive electric charges. That is, a preferable form of the colloidal silica particles is that the colloidal silica particles having positive electric charges and an anionic compound are combined, and the anionic compound is absorbed on the surfaces of the colloidal silica particles in the polishing fluid system, thereby exhibiting a negative $\xi$ potential at the surfaces of the colloidal silica particles.

As such, colloidal silica particles obtained by the hydrolysis of alkoxy silane containing no impurities, such as alkali metals, inside the particles are preferred as the colloidal silica particles that modify or improve the surfaces. On the other hand, colloidal silica particles manufactured by a method in which alkali metal is removed from an aqueous solution of alkali silicate can also be used; however, in this case, there is a concern that alkali metal remaining inside the particles will be gradually ejected and affect polishing performance. From such a viewpoint, colloidal silica particles obtained by the hydrolysis of alkoxy-silanes are more preferred as a raw material.

(Anion Compound)

Firstly, a colloidal silica particle having an anionic compound absorbed on the surface, which is one of the colloidal silica particles exhibiting a negative $\xi$ potential at the surface, will be described.

The anionic compound that is used here may be any of ordinary anionic compounds, and may be an inorganic anionic compound or an organic anionic compound. However, the anionic surfactant as described below is not included.

The concentration of the anionic compound in the polishing fluid is preferably 0.00005% by mass to 1% by mass, more preferably 0.0001% by mass to 1% by mass, and particularly preferably 0.001% by mass to 1% by mass with respect to the total mass of the polishing fluid from the viewpoint of forming a negative $\xi$ potential at the surfaces of the colloidal silica particles and controlling the polishing rate.

The fact that colloidal silica particles exhibiting a negative $\xi$ potential at the surfaces can be created by making an anionic compound work at the colloidal silica particles having positive electric charges can be confirmed as follows.

That is, it can be confirmed by checking, when a polishing fluid B is obtained by adding the anionic compound to a polishing fluid A containing an oxidant and a corrosion inhibitor, whether the polishing rate of the polishing fluid B becomes 80% or lower of the polishing rate of the polishing fluid A, which is the polishing fluid before the anionic compound is added. The preferable polishing rate is 50% or lower of the polishing rate when the polishing fluid A is used.

The above method makes it possible to confirm that colloidal silica particles exhibiting a negative $\xi$ potential at the surfaces are formed, and polishing selectivity is improved by the colloidal silica particles exhibiting a negative $\xi$ potential at the surfaces.

The compound and the colloidal silica particles may be merely mixed in order to make the above anionic compound absorbed on the surfaces of the colloidal silica particles.

Thereby, the anionic compound having the above structure is absorbed on the surfaces of the colloidal silica particles having a slight number of negative electric charges, and the colloidal silica particles exhibiting a negative $\xi$ potential at the surface are obtained.

Here, the $\xi$ potential at the surfaces of the colloidal silica particles can be measured by a method, such as the electrophoresis method and the ultrasonic oscillation method, in the invention. Examples of specific measuring instruments that can be used include DT-1200 (manufactured by Nihon Rufuto Co., Ltd.).

The range of the $\xi$ potential is not particularly limited, but is preferably −50 mV to −3 mV, more preferably −30 mV to −3 mV, and particularly preferably −20 mV to −5 mV.

The particle diameter of the colloidal silica particles, which become a raw material, is appropriately selected according to the purpose of use. The average primary particle diameter is preferably in a range of 5 nm to 100 nm, more preferably in a range of 10 nm to 100 nm, and further preferably in a range of 10 nm to 80 nm as the particle diameter of the colloidal silica particles. In addition, the average secondary particle diameter of the colloidal silica particles is preferably in a range of 10 nm to 300 nm, more preferably in a range of 20 nm to 300 nm, and further preferably in a range of 20 nm to 200 nm.

A particularly preferred embodiment of the colloidal silica particles in the invention has an average primary particle diameter in a range of 5 nm to 100 nm and an average secondary particle diameter in a range of 10 nm to 300 nm.

The occurrence of polishing flaws can be effectively suppressed when the particle diameter of the colloidal silica particles is in the above range.

Here, the average primary particle diameter of the colloidal silica particles in the invention refers to the particle diameter at the 50% point of the cumulative frequency in a particle size cumulative curve obtained by the volume standard.

Meanwhile, the average primary particle diameter of the colloidal silica particles can be measured using an electronic microscope (transmission type) or the like.

In addition, the average particle diameter of secondary particles formed by an assembly of some of the colloidal silica particles (average secondary particle diameter) represents the average particle diameter obtained in the particle size distribution obtained by the dynamic light scattering method. Examples of measuring apparatuses that can be used to obtain the particle size distribution include LB-500 (manufactured by Horiba, Ltd.) and the like.

The content of the colloidal silica particles in the polishing fluid of the invention is preferably 0.5% by mass to 10% by mass, further preferably 0.5% by mass to 8% by mass, and particularly preferably 1% by mass to 7% by mass with respect to the total mass of the polishing fluid (hereinafter, representing polishing fluids used for polishing, that is, diluted polishing fluids when polishing fluids are diluted by water or an aqueous solution. The "polishing fluids used for polishing" described hereinafter also have the same meaning). That is, the content of the colloidal silica particles is preferably 0.5% by mass or more from the standpoint of polishing the second layer at a sufficient polishing rate, and is preferably 10% by mass or less from the standpoint of storage stability.

Abrasive grains other than the colloidal silica particles can be jointly used in the polishing fluid of the invention as long as the effects of the invention are not impaired; however, even in such a case, the fraction of the colloidal silica particles exhibiting a negative ξ potential at the surfaces in the total abrasive grains is preferably 50% by mass or more, and particularly preferably 80% by mass or more. All of the abrasive grains included may be colloidal silica particles exhibiting a negative ξ potential at the surfaces.

Examples of the abrasive grains that can be jointly used with the colloidal silica particles in the polishing fluid of the invention include fumed silica, ceria, alumina, titania, and the like. The size of the jointly used abrasive grains is preferably equal to or larger than that of the colloidal silica particles exhibiting a negative ξ potential at the surfaces and equal to or smaller than double.

[Specific Inorganic Phosphate Compound]

The polishing fluid of the invention contains at least one inorganic phosphate compound selected from phosphoric acid ($H_3PO_4$), pyrophosphoric acid ($H_4P_2O_7$), and a polyphosphoric acid. Here, the polyphosphoric acid includes condensed phosphoric acid ($H_{n+2}P_nO_{3n+1}$) and metaphosphoric acid ($HPO_3)_n$, wherein 'n' represents an integer of 3 or larger.

When addition of the compound results in a relationship of (RRa)>(RRb), wherein 'RRa' is the polishing rate with respect to silicon nitride, and 'RRb' is the polishing rate when the compound is not added, the compound may be defined as having a function of an accelerator with respect to silicon nitride. Whether the compound has a function of the accelerator with respect to silicon nitride can be determined by the presence or absence of the above relationship.

The inorganic phosphate compound included in the polishing fluid may be only one or two or more. The content of the inorganic phosphate compound in the polishing fluid is preferably 0.001% by mass to 15% by mass, more preferably 0.005% by mass to 10% by mass, and further preferably 0.05% by mass to 5% by mass with respect to the mass of the polishing fluid used for polishing. That is, the content of the inorganic phosphate compound is preferably the lower limit or higher from the standpoint of achieving a sufficient polishing rate, and is preferably the upper limit or lower from the standpoint of maintaining a favorable flatness.

[Specific Anionic Surfactant]

The polishing fluid of the invention preferably contains at least one of the anionic surfactants represented by any of the following general formulas (I) to (V).

$$R^1\text{—}SO_3X \quad (I)$$

[In the general formula, '$R^1$' represents alkyl groups, alkenyl groups, cycloalkyl groups, aryl groups, aralkyl groups, all of which have a carbon number of 6 to 30, and groups formed by combining 2 or more of the above groups. 'X' represents a hydrogen atom, lithium, sodium, potassium, an ammonium cation, and quaternary ammonium cations.]

$$R^1\text{—}O\text{—}SO_3X \quad (II)$$

[In the general formula (II), '$R^1$' represents alkyl groups, alkenyl groups, cycloalkyl groups, aryl groups, aralkyl groups, all of which have a carbon number of 6 to 30, or groups formed by combining 2 or more of the above groups. 'X' represents a hydrogen atom, sodium, potassium, an ammonium cation, quaternary ammonium cations, diethanolamine, or triethanolamine.]

$$R^2\text{—}O\text{—}(CH_2CH_2O)_n\text{—}SO_3X \quad (III)$$

[In the general formula (III), '$R^2$' represents alkyl groups, alkenyl groups, cycloalkyl groups, aryl groups, aralkyl groups, all of which have a carbon number of 6 to 30, or groups formed by combining 2 or more of the above groups. 'n' represents an integer of 1 to 10. 'X' represents the same as in the general formula (II).]

GENERAL FORMULA (IV)

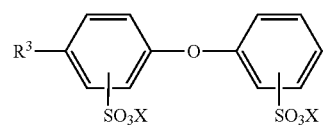

[In the general formula (IV), '$R^3$' represents alkyl groups, alkenyl groups, cycloalkyl groups, aryl groups, aralkyl groups, all of which have a carbon number of 6 to 30, or groups formed by combining 2 or more of the above groups, 'X' represents the same as in the general formula (II), and a plurality of Xs may be mutually the same or different.]

GENERAL FORMULA (V)

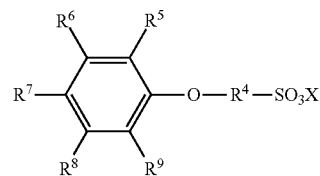

[In the general formula (V), '$R^4$' represents alkylene groups, alkynylene groups, cycloalkylene groups, arylene groups, alkylene oxide groups, all of which have a carbon number of 1 to 20, or groups formed by combining 2 or more of the above groups. '$R^5$ to $R^9$' independently represent any of a hydrogen atom, a hydroxyl group, alkyl groups, alkenyl groups, cycloalkyl groups, aryl groups, aralkyl groups, sulfo groups, carboxyl groups, all of which have a carbon number of 1 to 30, and hydrocarbon groups including the above. 'X' represents the same as in the general formula (II).]

Specific examples of the anionic surfactant will be shown below. The invention is not limited to these compounds.

[Chemical 7]

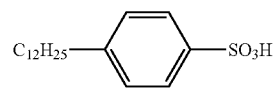

P1

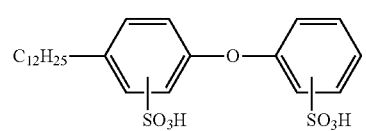

P2

P3

$C_{12}H_{25}\text{—}SO_3H$

P4

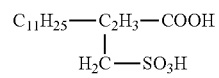

P5

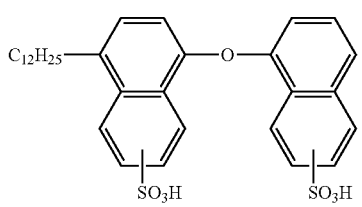

P6

The number of the anionic surfactants that are used may be one or two or more. The content of the anionic surfactant is preferably 0.001% by mass to 1% by mass, more preferably 0.01% by mass to 1% by mass, and further preferably 0.1% by mass to 1% by mass with respect to the mass of the polishing fluid used for polishing. The content of the anionic surfactant in the above range makes the effect of suppressing the polishing rate of polysilicon favorable.

Here, the actions of the surfactant, including presumptions, will be outlined. Since the surfaces of polysilicon are hydrophobic in comparison to other films, the surfactant can be absorbed. For example, it is presumed that, when the anionic surfactant is added, hydrophobic portions of the surfactant are disposed on the polysilicon surfaces, and anionic hydrophilic portions are disposed in a shape of facing outside. In summary, it is presumed that, when the anionic surfactant is added, an absorption layer is formed on the polysilicon surface, and the surface electric charges are anionic. When colloidal silica particles having a negative ξ potential are present in such an absorption layer, it is presumed that a repulsive force is developed between the colloidal silica particles and the polysilicon by the negative electric charges of the two. It is presumed that both this repulsive force and the action of the coexisting inorganic phosphate compound reduce the contact frequency between the two, and, consequently, the polishing rate is significantly suppressed.

[Organic Acid]

In addition, other ordinary organic acids can be jointly used in the polishing fluid of the invention as long as the effects of the invention are not impaired.

The other organic acids are desirably water-soluble acids, and examples thereof include water-soluble organic acids and amino acids. More appropriate examples of the organic acids and amino acids include ones selected from the following groups.

That is, examples of the organic acids include formic acid, acetic acid, propionic acid, butyric acid, valeric acid, 2-methyl butyric acid, n-hexanoic acid, 3,3-dimethylbutyrate, 2-ethylbutyric acid, 4-methyl pentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, acidum tartaricum, citric acid, lactic acid, hydroxylethyl iminodiacetic acid, iminodiacetic acid, acetamido iminodiacetic acid, nitrilotripropanoic acid, nitrilotrimethylphosphoric acid, dihydroxyethyl glycine, tricine, salts, such as ammonium salts thereof or alkali metal salts, mixtures thereof, and the like.

In addition, examples of the amino acids include glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxin, 4-hydroxy-L-proline, L-cysteine, L-methionine, L-ethionine, L-lanthionine, L-cystathionine, L-cystine, L-cysteic acid, L-asparagine acid, L-glutamic acid, S-(carboxylmethyl)-L-cystine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothionein, L-tryptophan, actinomycin C1, apamin, angiotensin angiotensin II, antipain, and the like.

Furthermore, examples of organic acids that can be jointly used include nitrilotriacetic acid, diethylenetriamine pentaacetic acid, ethylenediaminetetraacetic acid, oxalic acid, malonic acid, succinic acid, glutaric acid, adipic acid, pimelic acid, maleic acid, phthalic acid, malic acid, tartaric acid, citric acid, diglycolic acid, 2-furan carboxylic acid, 2,5-furan dicarboxylic acid, 3-furan carboxylic acid, 2-tetrahydro furan carboxylic acid, diglycolic acid, methoxyacetic acid, methoxyphenyl acetic acid, phenoxyacetic acid, mixtures thereof, and the like. Among the above, ethylenediaminetetraacetic acid, oxalic acid, malonic acid, succinic acid, glutaric acid, adipic acid, pimelic acid, maleic acid, phthalic acid, malic acid, tartaric acid, citric acid, and diglycolic acid are preferred from the standpoint of achieving a favorable selection ratio, and oxalic acid, adipic acid, pimelic acid, maleic acid, malic acid, tartaric acid, citric acid, and diglycol acid are more preferred.

When the other organic acids are jointly used, the total content of the organic acids is preferably 0.01% by mass to 10% by mass, more preferably 0.1% by mass to 10% by mass, and further preferably 0.5% by mass to 5% by mass with respect to the mass of the polishing fluid used for polishing.

[Other Components]

Arbitrary components other than the above essential components may be added to the polishing fluid of the invention according to necessity. Hereinafter, other components that may be used arbitrarily will be described.

(Corrosion Inhibitor)

A corrosion inhibitor, which is absorbed on a surface to be polished and forms a membrane, thereby suppressing corrosion of metal surfaces, may be included in the polishing fluid of the invention. It is preferable to include a complex aromatic compound having 3 or more nitrogen atoms in the molecule and a ring-fused structure as the corrosion inhibitor in the invention. Here, the "3 or more nitrogen atoms" are preferably atoms composing the fused ring, and such a complex aromatic compound is preferably benzotriazole and a derivative formed by introducing a variety of substituent groups to benzotriazole.

Examples of the corrosion inhibitor that can be used in the invention include benzotriazole (hereinafter also referred to as "BTA"), 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, 1-(hydroxymethyl) benzotriazole, and the like, and it is more preferable to select from 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl) benzotriazole among the above.

The added amount of the corrosion inhibitor is preferably 0.01% by mass to 0.2% by mass, and further preferably 0.05% by mass to 0.2% by mass with respect to the mass of the polishing fluid used for polishing. That is, the added amount of the corrosion inhibitor is preferably 0.01% by mass or more from the standpoint of preventing the enlargement of dishing, and is preferably 0.2% by mass or less from the standpoint of storage stability.

(Oxidant)

The polishing fluid of the invention may contain a compound that oxidizes metal (oxidant), which is a polishing workpiece.

Examples of the oxidant include hydrogen peroxide, peroxide, nitrate, iodate, periodate, hypochlorite, chlorite, chlorate, perchlorate, persulfate, dichromate, permanganate, ozone water, silver (II) salt, and iron (III) salt, and hydrogen peroxide is preferably used.

Meanwhile, examples of the iron (III) salt that is preferably used include organic complex salts of iron (III) as well as salts of inorganic iron (III), such as iron (III) nitrate, iron (III) chloride, iron (III) sulfate, iron (III) bromide.

(pH Adjuster)

The polishing fluid of the invention needs to be pH 1.5 to 5.0. The lower limit is not particularly limited as long as the limit is equal to or larger than the left value, but is preferably pH 1.5 or higher, further preferably pH 1.7 or higher, more preferably pH 1.8 or higher, and particularly preferably pH 2.0 or higher. The upper limit is also not limited, but is preferably pH 4.5 or lower, and more preferably pH 4.0 or lower. The polishing fluid of the invention exhibits excellent effects with the pH in the above range.

Alkali/acid or a buffer is used in order to adjust the pH of the polishing fluid to the above range.

Preferable examples of the alkali/acid or the buffer include ammonia, ammonium hydroxide, and organic ammonium hydroxides, such as tetramethyl ammonium hydroxide; non-metallic alkali agents, such as alkano lamines, such as diethanolamine, triethanolamine, and triisopropanolamine; alkali metal hydroxides, such as sodium hydroxide, potassium hydroxide, and lithium hydroxide; inorganic acids, such as nitric acid, sulfuric acid, and phosphoric acid; carbonates, such as sodium carbonate; phosphates, such as trisodium phosphate; borate, tetraborate, and hydroxylbenzoate. Particularly preferable examples of the alkali agents include ammonium hydroxide, potassium hydroxide, lithium hydroxide, and tetramethyl ammonium hydroxide.

The added amount of the alkali/acid or the buffer may be any amount as long as the pH is maintained in the preferable range, but is preferably 0.0001 moles to 1.0 mole, and more preferably 0.003 moles to 0.5 moles in 1 L of the polishing fluid used for polishing. Meanwhile, the pH in the invention is measured by the measuring method as employed in the examples below unless otherwise described.

(Chelating Agent)

The polishing fluid of the invention preferably contains a chelating agent (that is, a water softener) according to necessity in order to reduce the adverse effects of interfused multivalent metal ions or the like.

The chelating agent is a commonly used water softener, which is a precipitation inhibitor of calcium or magnesium, or related compounds thereof. Examples of the chelating agent include nitrilotriacetic acid, diethylenetriaminepentaacetic acid, ethylenediaminetetraacetic acid, N,N,N-aminotrimethylene phosphonic acid, ethylenediamine-N,N,N',N'-tetramethylene sulfonic acid, transcyclohexanediaminetetraacetic acid, 1,2-diaminopropane tetraacetic acid, glycol ether diamine tetraacetic acid, ethylenediamine ortho-hydroxyphenyl acetic acid, (S,S)-ethylenediamine disuccinic acid, N-(2-carboxylate ethyl)-L-asparagine acid, β-alanine diacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, 1,2-dihydroxybenzene-4,6-disulfonic acid, and the like.

Two or more of the chelating agents may be jointly used according to necessity.

The added amount of the chelating agent may be any amount as long as the amount is enough to block metal ions, such as interfusing multivalent metal ions, and, for example, the chelating agent is added to be 0.0003 moles to 0.07 moles in 1 L of the polishing fluid used for polishing.

[Semiconductor Substrate (Polishing Workpiece)]

Figure 1A:
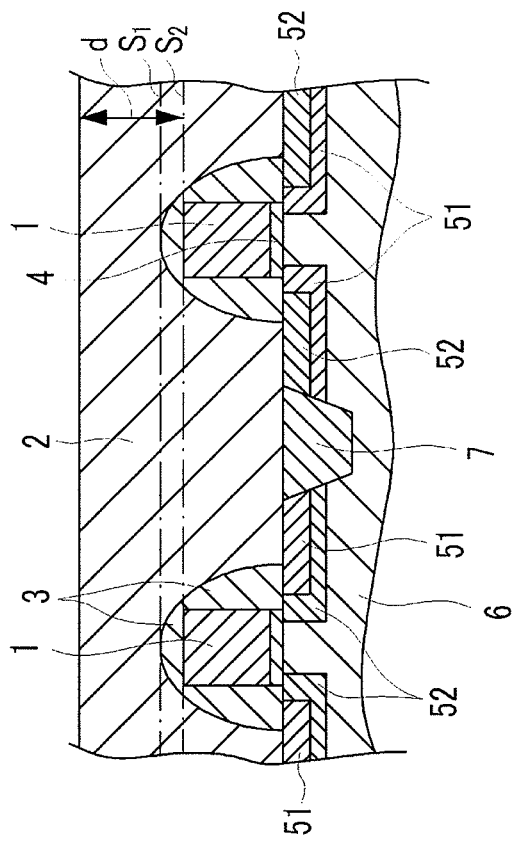

A polishing workpiece to which the polishing fluid of the invention is preferably applied is a polishing workpiece (semiconductor substrates) that is configured to have at least a first layer 1 including polysilicon or modified polysilicon, and a second layer 2 including at least one selected from a group consisting of silicon oxide, silicon nitride, silicon carbide, silicon carbonitride, silicon oxycarbide, and silicon oxynitride (refer to FIG. 1). In more detail, the workpiece is a preferably used workpiece when polysilicon or modified polysilicon is applied as an electrode material, and a gate electrode is formed by the CMP in a semiconductor integrated circuit.

Meanwhile, the "modified polysilicon" in the invention includes silicon obtained by doping impurity elements, such as boron (B) or phosphorous (P), in polysilicon.

In general, when a gate electrode is formed, a layer made of silicon oxide and the like is formed on the surface of the substrate, recess portions are formed on the layer by etching or the like, the formed recess portions are filled with polysilicon or modified polysilicon, thereby forming a first layer 1. Next, a second layer 2 including at least one selected from a group consisting of silicon oxide, silicon nitride, silicon carbide, silicon oxynitride, silicon oxycarbide, and silicon carbonitride is laminated on the surface of the first layer as a barrier layer.

In the CMP used for the formation of the gate electrode, polishing begins from the surface of the second layer 2, polishing of the second layer 2 proceeds, and the polishing rate abruptly decreases when the surface of the first layer 1 is exposed, thereby detecting that the polishing of the second layer 2 is finished, and excessive polishing of the surface 11 of polysilicon or modified polysilicon used for the gate electrode is suppressed with respect to the second layer surface 21 of this moment. The modified polysilicon represents polysilicon obtained by doping impurities, such as B or P, in polysilicon.

After that, polysilicon or modified polysilicon which functions as the electrode and places other than the necessary silicon oxide layer in the peripheral portion are removed by etching so as to form the gate electrode.

Meanwhile, in FIG. 1, '1' is the first layer, '2' is the second layer, '3' is a third layer (SiN layer), '4' is a dielectric layer (low-k material layer), '51' is a n-type semiconductor layer, '52' is a p-type semiconductor layer, '6' is a Si substrate, '7' is an insulator layer, '11' is a polished first layer surface, and '21' is a polished second layer surface. 'd' is the polishing depth, '$S_1$' is a third layer top surface, and '$S_2$' is a first layer top surface.

[Electrical Conductivity]

The electrical conductivity of the polishing fluid of the invention is preferably 0.01 (mS/cm) to 12 (mS/cm), more preferably 1 (mS/cm) to 12 (mS/cm), and particularly preferably 3 (mS/cm) to 10 (mS/cm). A method of measuring the electrical conductivity is not particularly limited, but the method as described in the examples below will be employed unless otherwise described.

[Polishing Method]

The polishing method of the invention is a method in which the polishing fluid of the invention as described above is used and supplied to a polishing pad on a polishing platen, and the polishing platen is rotated so that the polishing pad is relatively moved while in continuous contact with the surface to be polished of a polishing workpiece, thereby performing polishing.

The polishing fluid of the invention is made into a fluid to be used: 1 by using a concentrated solution as the polishing fluid and diluting the polishing fluid by adding water or an aqueous solution when used; 2 by preparing each of the components in the aqueous solution form as described in the next section, mixing the solutions, and diluting the polishing fluid by adding water according to necessity; and 3. by preparing the polishing fluid as a fluid to be used. The polishing fluid of any case can be applied to the polishing method of the invention.

Ordinary polishing apparatuses having a holder that supports a polishing workpiece (for example, a wafer having a conductive material film formed thereon and the like) having a surface to be polished and a polishing platen (having a motor or the like capable of varying the rotation frequency mounted therein) to which a polishing pad is attached can be used as an apparatus used for polishing. Examples of the polishing pad that can be used include ordinary nonwoven fabrics, expanded polyurethane, porous fluororesins, and the like, and are not particularly limited. In addition, the polishing conditions are not particularly limited, but the rotation speed of the polishing platen is preferably a low rotation of 200 rpm or less so that a polishing workpiece does not fly away. The pressure that presses a polishing workpiece having a surface to be polished (a film to be polished) to the polishing pad is preferably 0.68 kPa to 34.5 kPa, and more preferably 3.40 kPa to 20.7 kPa in order to satisfy the evenness of polishing rate inside the surface of the polishing workpiece and the flatness of a pattern.

The polishing fluid is continuously supplied to the polishing pad by a pump or the like during polishing.

After the completion of polishing, the polishing workpiece is washed well in flowing water, shaken to remove water droplets attached to the polishing workpiece, and dried using a spin dryer and the like.

When the concentrated solution is diluted as described in the above method 1 in the invention, the aqueous solution described below can be used. The aqueous solution is water already containing at least one of an oxidant, an organic acid, an additive, and a surfactant, and the total components of the components included in the aqueous solution and the components included in the concentrated solution to be diluted become the components of the polishing fluid used for polishing (fluid to be used).

Since components that are difficult to dissolve can be combined afterward in the aqueous solution form when the concentrated solution is diluted by the aqueous solution before use, a concentrated solution that is more concentrated can be manufactured.

Examples of a method for diluting the concentrated solution by adding water or an aqueous solution include a method in which the concentrated polishing fluid and water or an aqueous solution are mixed by joining the pipe supplying the concentrated polishing fluid and the pipe supplying water or an aqueous solution in the middle, and the fluid to be used of the mixed and diluted polishing fluid is supplied to the polishing pad. Methods that are usually carried out, such as a method in which the two fluids are collided and mixed through narrow passages in a state of pressure being applied, a method in which glass tubes and the like in the pipe are filled with a filler so that the flows of the fluids are repeatedly separated and joined, and a method in which power-rotated blades are provided in the pipe, can be employed for the mixing of the concentrated fluid and water or an aqueous solution.

The supply rate of the polishing fluid is preferably 10 ml/min to 1000 ml/min, and more preferably 170 ml/min to 800 ml/min to satisfy the evenness of polishing rate inside the surface to be polished and the flatness of a pattern.

Furthermore, examples of a method of polishing while the concentrated solution is continuously diluted by water, an aqueous solution, or the like include a method in which a pipe supplying the polishing fluid and a pipe supplying water or an aqueous solution are independently provided, a predetermined amount of the fluid is supplied to a polishing pad from each of the pipes, and polishing is carried out while the two are mixed by the relative movement of the polishing pad and the surface to be polished. In addition, a method in which a predetermined amount of the concentrated solution and a predetermined amount of water or an aqueous solution are fed and mixed in a vessel, and the mixed polishing fluid is supplied to a polishing pad, thereby performing polishing, can also be used.

In addition, another example of the polishing method includes a method in which the components that the polishing fluid should contain are divided into at least two constituent components, the constituent components are diluted by adding water or an aqueous solution when used, supplied to the polishing pad on the polishing platen, brought into contact with the surface to be polished, and polishing is carried out by the relative movement of the surface to be polished and the polishing pad.

In addition, low-solubility additives are divided into two constituent components (A) and (B). For example, an oxidant, an additive, and a surfactant belong to the constituent component (A), and an organic acid, an additive, a surfactant, and water belong to the constituent component (B), water or an aqueous solution is added when the above are used, and the constituent component (A) and the constituent component (B) are diluted and used.

In the case of the above example, three pipes supplying the constituent component (A), the constituent component (B), and water or an aqueous solution are required respectively, and dilution mixing can be done by a method in which the three pipes are joined to one pipe supplying the polishing fluid to the polishing pad, and mixing is performed inside the pipe. In this case, it is possible to join two pipes and then join the remaining pipe. Specifically, in the method, the constituent component including an additive that is difficult to dissolve and other constituent components are mixed, a mixing passage is elongated so as to secure a dissolution time, and, furthermore, the pipe of water or an aqueous solution is joined.

Other mixing methods include a method in which each of the three pipes is directly connected to the polishing pad, and mixing is carried out by the relative movement of the polishing pad and the surface to be polished, and a method in which the three constituent components are mixed in a vessel, and the diluted polishing fluid is supplied to the polishing pad from the vessel.

In the polishing method described above, it is possible to make one of the constituent components including an oxidant 40° C. or lower and heat the other constituent component to a range of 100° C. from room temperature, thereby making the fluid temperature 40° C. or lower when the first constituent component and the second constituent component are mixed or when water or an aqueous solution is added so as to dilute the concentrated solution. This method is a preferable method for increasing the solubility of the raw material of the polishing fluid having a low solubility by using a phenomenon in which the solubility increases as the temperature is high.

Since the raw material dissolved by heating the second constituent component to a range of 100° C. from room temperature is precipitated in the solution when the temperature decreases, it is necessary to perform heating in advance so as to dissolve the precipitated raw material when the second constituent component is used in a low-temperature state. For this, it is possible to employ means for heating and sending the fluid of the second constituent component in which the raw material is dissolved and means for stirring the fluid including the precipitates, sending the fluid, and heating the pipe so as to dissolve the precipitates. Since there is a concern of decomposition of the oxidant when the temperature of the first constituent component including the oxidant is increased to 40° C. or higher, it is preferable to mix the heated second constituent component and the first constituent component including the oxidant at 40° C. or lower.

As such, in the invention, the components of the polishing fluid may be divided into two or more groups and supplied to the surface to be polished. In this case, it is preferable to divide and supply the components including oxides and the components including organic acids. In addition, it is also possible to make the polishing fluid into a concentrated solution and separately supply dilution water to the surface to be polished.

In the invention, when a method in which the components of the polishing fluid are divided into two or more groups and supplied to the surface to be polished is applied, the supplied amount represents the sum of the supplied amounts from the respective pipes.

[Pad]

The polishing pad for polishing to which the polishing method of the invention can be applied may be a nonfoam-structured pad or a foam-structured pad. The former is a pad for which a hard synthetic resin bulk material, such as a plastic plate, is used. In addition, the latter includes an independent foam (dry foam-based), a continuous foam (wet foam-based), and a bilayer complex (lamination-based), and the bilayer complex (lamination-based) is particularly preferred. The foam may be homogeneous or inhomogeneous.

Furthermore, the pad may contain abrasive grains (for example, ceria, silica, alumina, a resin, and the like) that are usually used for polishing. In addition, there are hard pads and soft pads with regard to the hardness, and the pad may be any of the two. It is preferable to use a pad having different hardnesses in the respective layers among the lamination-based pads. Preferable examples of materials include non-woven fabrics, artificial leather, polyamide, polyurethane, polyester, polycarbonate, and the like. In addition, processing of lattice grooves/holes/concentric grooves/spiral grooves, and the like may be carried out on the surface that is brought into contact with the surface to be polished.

[Wafer]

The diameter of a wafer, which is a polishing workpiece as a subject of the CMP carried out using the polishing fluid of the invention, is preferably 200 mm or larger, and particularly preferably 300 mm or larger. When the diameter is 300 mm or larger, the effects of the invention are significantly exhibited.

[Polishing Apparatus]

Apparatuses that can carry out polishing using the polishing fluid of the invention are not particularly limited, and examples thereof include MA-300D (manufactured by Musashino Electronics Co., Ltd.), Mirra Mesa CMP, Reflexion CMP (Applied Materials, Inc.), FREX 200, FREX 300 (Ebara Corporation), NPS 3301, NPS 2301 (Nicon Corporation), A-FP-310A, A-FP-210A (Tokyo Seimitsu Co., Ltd.), 2300 TERES (Wolfram Research), Momentum (Speedfam IPEC), and the like.

Hereinafter, the invention will be described in more detail using examples, but the invention is not limited to the following examples within the scope of the gist of the invention.

EXAMPLE 1

<Preparation of a Polishing Fluid>

Polishing fluids having the compositions and pH shown in Table 1 were prepared. Moreover, in addition to the respective components shown in the table, ammonia water and nitric acid are added so as to make the pH described in the table, and pure water was added so as to make a total weight of 1,000 mL.

Colloidal silica particles (A1 to A9) used in each of the examples in the specification are shown in the following Table A. Furthermore, A1 to A9 are manufactured by Fusou Chemical Co., Ltd. Furthermore, the average primary particle diameters and the average secondary particle diameters in Table A are average values measured as a result of observing polished particles using a SEM.

TABLE A

| Abrasive grain particle | Product name | Average primary particle diameter (nm) | Average secondary particle diameter (nm) |
|---|---|---|---|
| A1 | PL3 | 35 | 70 |
| A2 | PL3L | 35 | — |
| A3 | PL3H | 25 | 75 |
| A4 | PL2 | 25 | 45 |
| A5 | PL2L | 25 | — |
| A6 | PL2H | 20 | 40 |
| A7 | PL1 | 15 | 25 |
| A8 | PL1H | 10 | 25 |
| A9 | PL3 (anion zole) | 35 | 70 |

TABLE B

| Abrasive grain particle | ξ potential (mV) | * Adjustment of pH of each original fluid using nitric acid |
|---|---|---|
| A1 | 2.7 mV | (near pH 2.0) |
| A2 | 2.6 mV | (near pH 2.0) |
| A3 | 3.0 mV | (near pH 2.0) |
| A4 | 2.8 mV | (near pH 2.0) |
| A5 | 2.5 mV | (near pH 2.0) |
| A6 | 3.0 mV | (near pH 2.0) |
| A7 | 1.5 mV | (near pH 2.0) |
| A8 | 2.0 mV | (near pH 2.0) |
| A9 | −20 mV | (near pH 2.0) |

<Evaluation Method>

-Polishing Apparatus-

The wafer shown below was polished as a polishing subject under the following conditions using "MA-300D," manufactured by Musashino Electronics Co., Ltd., as a polishing apparatus while a slurry was supplied under the following conditions, and the evaluation of the polishing fluid was carried out.

Table rotation frequency: 112 rpm
Head rotation frequency: 113 rpm
Polishing pressure: 18.4 kPa
Polishing pad: IC1400 XY-K-Pad, manufactured by Rodel-Nitta Corporation
Polishing fluid supply rate: 50 ml/min -Polishing Subject- An 8-inch wafer having a polysilicon layer (p-Si layer) as the first layer, a silicon oxide layer $(SiO_2$ layer) as the second layer, and a silicon nitride layer $(Si_3N_4$ layer) as the third layer respectively formed on a Si substrate as shown in FIG. 1 was cut into 6 cm×6 cm, and the cut wafer was used as a polishing subject.

-Polishing Rate, Polishing Rate Ratio-

The polishing rate was computed by measuring the layer thicknesses (nm) before and after polishing for each of the polysilicon layer (p-Si layer), the silicon oxide layer $(SiO_2$ layer), and the silicon nitride layer $(Si_3N_4$ layer), and using the following formula. Meanwhile, the layer thickness was measured using a noncontact-type film thickness measuring apparatus FE-33 (manufactured by Otsuka Electronics Co., Ltd.).

Polishing rate (nm/min)=(film thickness before polishing−film thickness after polishing)/polishing time In addition, the polishing rate ratios represented by RR (other)/RR (p-Si) were computed for p-Si layer to $SiO_2$ layer and p-Si layer to $Si_3N_4$ layer.

The obtained results are shown in Table 1.

—Aging Stability—

The aging stability was compared by forcibly heating each of the polishing fluids under the condition of 60° C. for 2 weeks, and then measuring the average particle diameter (MPS) of the colloidal silica particles before and after aging. Meanwhile, the average particle diameter (MPS) was measured using a dynamic light scattering-type particle size distribution measuring apparatus LB-500 (manufactured by Otsuka Electronics Co., Ltd.).

AA: alteration from before to after aging is 3% or lower, and stability is extremely high.

A: alteration from before to after aging is 5% or lower, and stability is high.

B: alteration from before to after aging is 10% or lower, and there is a concern regarding stability (on a level of no practical problem).

C: alteration from before to after aging is 10% or higher, and there is a problem of stability (on a level where practical use is impossible).

-ξ Potential-

The ξ potential of the particle was measured by the following method.

Here, in the invention, the ξ potential at the surface of the colloidal silica particle was evaluated by measuring the original fluid of the evaluation fluid using DT-1200 (manufactured by Nihon Rufuto Co., Ltd.).

-pH-

The pHs in the tables are values measured at room temperature (20° C.) using F-51 (trade name, manufactured by Horiba, Ltd.)

-Electrical Conductivity-

Here, in the invention, the electrical conductivity of the polishing fluid was evaluated by measuring the original fluid of the evaluation fluid using an electrical conductivity meter GM-60G (TOA-DKK).

TABLE 1

| Specimen | Polishing particle (content_particle diameter) | Accelerator (content) | Anionic surfactant (content) | Other additives (content) | pH | $Si_3N_4$ PR (nm/min) | Ox RR (nm/min) | Poly-Si RR (nm/min) | $Si_3N_4$ RR/ poly-Si RR | Ox RR/ poly-Si RR | Aging stability |
|---|---|---|---|---|---|---|---|---|---|---|---|
| 101 | A1 (150 g/L) | Inorganic phosphoric acid (5 g/L) | P2 (0.5 g/L) | | 1.5 | 75 | 82 | 6 | 12.50 | 13.67 | AA |
| 102 | A1 (150 g/L) | Inorganic phosphoric acid (5 g/L) | P2 (0.5 g/L) | | 2.0 | 78 | 80 | 5 | 15.60 | 16.00 | AA |
| 103 | A1 (150 g/L) | Inorganic phosphoric acid (5 g/L) | P2 (0.5 g/L) | | 2.5 | 65 | 58 | 7 | 9.29 | 8.29 | AA |
| 104 | A1 (150 g/L) | Inorganic phosphoric acid (5 g/L) | P2 (0.5 g/L) | | 3.0 | 53 | 47 | 9 | 5.89 | 5.22 | AA |
| 105 | A1 (150 g/L) | Inorganic phosphoric acid (5 g/L) | P2 (0.5 g/L) | | 4.0 | 40 | 36 | 8 | 5.00 | 4.50 | A |
| 106 | A1 (150 g/L) | Inorganic phosphoric acid (5 g/L) | P2 (0.5 g/L) | | 4.5 | 35 | 35 | 13 | 2.69 | 2.69 | A |
| c11 | A1 (150 g/L) | Inorganic phosphoric acid (5 g/L) | P2 (0.5 g/L) | | 7.0 | 15 | 18 | 25 | 0.60 | 0.72 | C |
| c12 | A1 (150 g/L) | Inorganic phosphoric acid (5 g/L) | P2 (0.5 g/L) | | 10.0 | 8 | 30 | 70 | 0.11 | 0.43 | B |
| 201 | A2 (150 g/L) | Inorganic phosphoric acid (5 g/L) | P2 (0.5 g/L) | | 2.0 | 65 | 68 | 12 | 5.42 | 5.67 | AA |
| 202 | A3 (150 g/L) | Inorganic phosphoric acid (5 g/L) | P2 (0.5 g/L) | | 2.0 | 70 | 71 | 4 | 17.50 | 17.75 | AA |
| 203 | A4 (150 g/L) | Inorganic phosphoric acid (5 g/L) | P2 (0.5 g/L) | | 2.0 | 72 | 68 | 4 | 18.00 | 17.00 | AA |
| 204 | A5 (150 g/L) | Inorganic phosphoric acid (5 g/L) | P2 (0.5 g/L) | | 2.0 | 58 | 53 | 8 | 7.25 | 6.63 | AA |
| 205 | A6 (150 g/L) | Inorganic phosphoric acid (5 g/L) | P2 (0.5 g/L) | | 2.0 | 61 | 63 | 3 | 20.33 | 21.00 | AA |
| 206 | A7 (150 g/L) | Inorganic phosphoric acid (5 g/L) | P2 (0.5 g/L) | | 2.0 | 49 | 39 | 3 | 16.33 | 13.00 | AA |
| 207 | A8 (150 g/L) | Inorganic phosphoric acid (5 g/L) | P2 (0.5 g/L) | | 2.0 | 30 | 25 | 3 | 10.00 | 8.33 | AA |
| 208 | A9 (150 g/L) | Inorganic phosphoric acid (5 g/L) | P2 (0.5 g/L) | | 2.0 | 80 | 65 | 2 | 40.00 | 32.50 | AA |
| c22 | None | Inorganic phosphoric acid (5 g/L) | P2 (0.5 g/L) | | 2.0 | 0 | 0 | 0.3 | — | — | AA |
| 301 | A1 (150 g/L) | Inorganic phosphoric acid (0.05 g/L) | P2 (0.5 g/L) | | 2.0 | 58 | 65 | 4 | 14.50 | 16.25 | AA |

TABLE 1-continued

| Specimen | Polishing particle (content_particle diameter) | Accelerator (content) | Anionic surfactant (content) | Other additives (content) | pH | Si₃N₄ PR RR (nm/min) | Ox RR (nm/min) | Poly-Si RR (nm/min) | Si₃N₄ RR/ poly-Si RR | Ox RR/ poly-Si RR | Aging stability |
|---|---|---|---|---|---|---|---|---|---|---|---|
| 302 | A1 (150 g/L) | Inorganic phosphoric acid (0.5 g/L) | P2 (0.5 g/L) | | 2.0 | 72 | 71 | 5 | 14.40 | 14.20 | AA |
| 303 | A1 (150 g/L) | Inorganic phosphoric acid (2 g/L) | P2 (0.5 g/L) | | 2.0 | 79 | 79 | 5 | 15.80 | 15.80 | AA |
| 304 | A1 (150 g/L) | Inorganic phosphoric acid (10 g/L) | P2 (0.5 g/L) | | 2.0 | 80 | 79 | 4 | 20.00 | 19.75 | A |
| 305 | A1 (150 g/L) | Inorganic phosphoric acid (50 g/L) | P2 (0.5 g/L) | | 2.0 | 76 | 80 | 5 | 15.20 | 16.00 | A |
| 306 | A1 (150 g/L) | Inorganic pyrophosphoric acid (0.8 g/L) | P2 (0.5 g/L) | | 3.0 | 54 | 63 | 5 | 10.80 | 12.60 | AA |
| 307 | A1 (150 g/L) | Inorganic pyrophosphoric acid (8 g/L) | P2 (0.5 g/L) | | 3.0 | 71 | 75 | 6 | 11.83 | 12.50 | A |
| 308 | A1 (150 g/L) | Inorganic polyphosphoric acid (0.1 g/L) | P2 (0.5 g/L) | | 2.0 | 45 | 51 | 5 | 9.00 | 10.20 | AA |
| 309 | A1 (150 g/L) | Inorganic polyphosphoric acid (1 g/L) | P2 (0.5 g/L) | | 2.0 | 68 | 66 | 5 | 13.60 | 13.20 | A |
| 310 | A1 (150 g/L) | Inorganic polyphosphoric acid (10 g/L) | P2 (0.5 g/L) | | 2.0 | 70 | 68 | 6 | 11.67 | 11.33 | A |
| c31 | A1 (150 g/L) | None | P2 (0.5 g/L) | | 2.0 | 11 | 13 | 10 | 1.10 | 1.30 | A |
| 401 | A1 (150 g/L) | Inorganic phosphoric acid (5 g/L) | P2 (0.05 g/L) | | 2.0 | 78 | 80 | 8 | 9.75 | 10.00 | AA |
| 402 | A1 (150 g/L) | Inorganic phosphoric acid (5 g/L) | P2 (5.0 g/L) | | 2.0 | 78 | 80 | 3 | 26.00 | 26.67 | A |
| 403 | A1 (150 g/L) | Inorganic phosphoric acid (5 g/L) | P1 (0.2 g/L) | | 3.0 | 51 | 46 | 10 | 5.10 | 4.60 | AA |
| 404 | A1 (150 g/L) | Inorganic phosphoric acid (5 g/L) | P3 (0.5 g/L) | | 4.0 | 39 | 36 | 9 | 4.33 | 4.00 | AA |
| 405 | A1 (150 g/L) | Inorganic phosphoric acid (5 g/L) | P4 (0.5 g/L) | | 3.0 | 53 | 47 | 10 | 5.30 | 4.70 | AA |
| 406 | A1 (150 g/L) | Inorganic phosphoric acid (5 g/L) | P9 (0.5 g/L) | | 2.0 | 78 | 80 | 7 | 11.14 | 11.43 | A |
| c41 | A1 (150 g/L) | Inorganic phosphoric acid (5 g/L) | None | | 5.5 | 38 | 28 | 35 | 1.09 | 0.80 | AA |
| 501 | A1 (150 g/L) | Inorganic phosphoric acid (5 g/L) | P2 (0.5 g/L) | Sulfuric acid (2 g/L) | 2.0 | 84 | 85 | 5 | 17.00 | 17.00 | AA |
| 502 | A1 (150 g/L) | Inorganic phosphoric acid (5 g/L) | P2 (0.5 g/L) | Ethane sulfonic acid (2 g/L) | 2.0 | 82 | 83 | 4 | 20.75 | 20.75 | AA |
| 503 | A1 (150 g/L) | Inorganic phosphoric acid (5 g/L) | P2 (0.5 g/L) | Taurine (2 g/L) | 2.0 | 83 | 52 | 5 | 10.40 | 10.40 | AA |
| 504 | A1 (150 g/L) | Inorganic phosphoric acid (5 g/L) | P2 (0.5 g/L) | p-toluene sulfonic acid (2 g/L) | 2.0 | 85 | 81 | 5 | 16.20 | 16.20 | AA |
| c51 | A1 (150 g/L) | 1-hydroxy-1,1-diphosphoric acid (10 g/L) | P2 (0.5 g/L) | | 2.0 | 79 | 81 | 5 | 16.20 | 16.20 | A |
| 601 | A1 (150 g/L) | Inorganic phosphoric acid (5 g/L) | | | 2.0 | 72 | 82 | 14 | 5.14 | 5.86 | AA |
| 602 | A1 (150 g/L) | Inorganic phosphoric acid (5 g/L) | | | 2.5 | 78 | 78 | 13 | 6.00 | 6.00 | AA |
| 603 | A1 (150 g/L) | Inorganic phosphoric acid (5 g/L) | | | 3.0 | 74 | 72 | 12 | 6.17 | 6.00 | AA |
| 604 | A1 (150 g/L) | Inorganic phosphoric acid (2 g/L) | | | 2.0 | 75 | 85 | 15 | 5.00 | 5.67 | AA |
| 605 | A1 (300 g/L) | Inorganic phosphoric acid (5 g/L) | | | 2.0 | 102 | 140 | 18 | 5.67 | 7.78 | AA |

TABLE 2

| Polishing fluid specimen No. | Electrical conductivity (mS/cm) |
|---|---|
| 101 | 6.20 |
| 102 | 6.46 |
| 103 | 7.23 |
| c11 | 23.5 |
| c12 | 32.5 |
| 201 | 6.46 |
| 202 | 6.45 |
| 203 | 6.46 |
| c22 | 5.53 |
| 301 | 5.59 |
| 302 | 5.45 |
| 303 | 5.83 |
| c31 | 1.08 |
| 401 | 6.15 |
| 402 | 6.89 |
| 403 | 6.55 |
| c41 | 6.35 |
| 501 | 9.56 |
| 502 | 9.12 |
| 503 | 9.83 |
| c51 | 15.6 |
| 601 | 6.43 |
| 602 | 6.13 |
| 603 | 5.99 |

What is claimed is:

1. A polishing fluid used for the chemical mechanical polishing of semiconductor substrates that are configured to have at least a first layer including polysilicon or modified polysilicon, and a second layer including at least one selected from the group consisting of silicon oxide, silicon nitride, silicon carbide, silicon carbonitride, silicon oxycarbide, and silicon oxynitride,
consisting essentially of each of the components represented by the following (1)-(3), the pH being 1.5 to 5.0, and provided that a polishing workpiece can be polished in a range of a ratio represented by RR (other) / RR (p-Si) when the polishing rate of the first layer is RR (p-Si), and the polishing rate of the second layer is RR (other) of 1.5 to 200:
(1) colloidal silica particles;
(2) at least one inorganic phosphate compound selected from phosphoric acid, pyrophosphoric acid, and polyphosphoric acid, the amount of the inorganic phosphate compound being in the range of 0.05-5% by mass; and
(3) water.

2. The polishing fluid according to claim 1,
wherein the concentration of the colloidal silica particles is 0.1% by mass to 10% by mass with respect to the total mass of the polishing fluid.

3. The polishing fluid according to claim 1,
wherein the average primary particle diameter of the colloidal silica particles is 5 nm to 100 nm, and the average secondary particle diameter is in a range of 10 nm to 300 nm.

4. The polishing fluid according to claim 1,
wherein the colloidal silica particles have a negative $\xi$ potential, and the $\xi$ potential is −50 mV to −5 mV.

5. The polishing fluid according to claim 1,
wherein the electrical conductivity of the polishing fluid is in a range of 0.01 (mS/cm) to 12 (mS/cm).

6. The polishing fluid according to claim 1, wherein the second layer of the semiconductor substrate includes at least silicon nitride.

7. The polishing fluid according to claim 1, wherein the content of the inorganic phosphate compound is 0.001% by mass to 10% by mass.

8. The polishing fluid according to claim 1, further including an anionic surfactant represented by the general formula (I) as a fourth component:

$$R^1-SO_3X \qquad (I)$$

wherein in the general formula (I), $R^1$ represents an alkyl group, an alkenyl group, a cycloalkyl group, an aryl group, or an aralkyl group, all of which have a carbon number of 6 to 30, and groups formed by combining 2 or more of these groups; and X represents a hydrogen atom, lithium, sodium, potassium, an ammonium cation, or a quaternary ammonium cation.

9. The polishing fluid according to claim 8, including at least one compound selected from the group consisting of compounds represented by the following general formula (II), general formula (III), general formula (IV), and general formula (V) instead of or together with the anionic surfactant represented by the general formula (I) as the fourth component:

$$R^1-O-SO_3X \qquad (II)$$

wherein in the general formula (II), $R^1$ represents an alkyl group, an alkenyl group, a cycloalkyl group, an aryl group, or an aralkyl group, all of which have a carbon number of 6 to 30, or groups formed by combining 2 or more of these groups; and X represents a hydrogen atom, sodium, potassium, an ammonium cation, a quaternary ammonium cation, diethanolamine, or triethanolamine;

$$R^2-O-(CH_2CH_2O)_n-SO_3X \qquad (III)$$

wherein in the general formula (III), $R^2$ represents an alkyl group, an alkenyl group, a cycloalkyl group, an aryl group, or an aralkyl group, all of which have a carbon number of 6 to 30, or groups formed by combining 2 or more of the these groups; n represents an integer of 1 to 10; and X represents has the same meaning as in the general formula (II);

GENERAL FORMULA (IV)

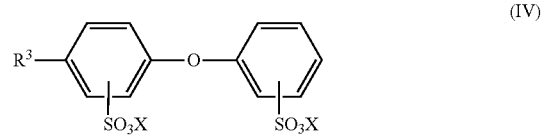

wherein in the general formula (IV), $R^3$ represents an alkyl group, an alkenyl group, a cycloalkyl group, an aryl group, or an aralkyl group, all of which have a carbon number of 6 to 30, or groups formed by combining 2 or more of these groups; X has the same meaning as in the general formula (II), and a plurality of Xs may be mutually the same or different;

GENERAL FORMULA (V)

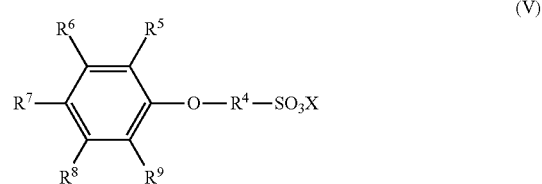

wherein in the general formula (V), $R^4$ represents an alkylene group, an alkynylene group, a cycloalkylene group, an arylene group, or an alkylene oxide group, all of which have a carbon number of 1 to 20, or groups formed by combining 2 or more of the these groups; $R^5$ to $R^9$ independently represent any of a hydrogen atom, a hydroxyl group, an alkyl group, an alkenyl group, a cycloalkyl group, an aryl group, an aralkyl group, a sulfo group, or a carboxyl group, all of which have a carbon number of 1 to 30, and hydrocarbon groups including the above; and X has the same meaning as in the general formula (II).

10. The polishing fluid according to claim 8, wherein the anionic surfactant is a multivalent anionic surfactant.

11. The polishing fluid according to claim 8, further comprising a pH adjuster.

12. The polishing fluid according to claim 8, wherein the concentration of the anionic surfactant is 0.001% by mass to 1% by mass with respect to the total mass of the polishing fluid.

13. A method of manufacturing a semiconductor device, wherein, each time a chemical mechanical polishing (CMP) method is carried out to polish a surface of a semiconductor substrate that is configured to have at least a first layer including polysilicon or modified polysilicon, and a second layer including at least one selected from the group consisting of silicon oxide, silicon nitride, silicon carbide, silicon carbonitride, silicon oxycarbide, and silicon oxynitride, a processing treatment including (a) a step in which a polishing fluid consisting essentially of each of the components of the following (1)-(3) and having a pH of 1.5 to 5.0 is prepared, (b) a step in which the polishing fluid is supplied to the surface of the semiconductor substrate, and a polishing pad is brought into contact with the surface of the semiconductor substrate, and (c) a step in which, each time the first layer and the second layer of the semiconductor substrate are polished, the polishing pad and the semiconductor substrate are relatively moved so that a polishing workpiece can be polished in a range of a ratio represented by RR (other) / RR (p-Si) when the polishing rate of the first layer is RR (p-Si), and the polishing rate of the second layer is RR (other) of 1.5 to 200 while the polishing pad is in continuous contact with the surface of the semiconductor substrate through the polishing fluid for a time sufficient enough to polish the second layer is carried out:

(1) colloidal silica particles;
(2) at least one inorganic phosphate compound selected from phosphoric acid, pyrophosphoric acid, and polyphosphoric acid, the amount of the inorganic phosphate compound being in the range of 0.05-5% by mass; and
(3) water.

14. The method of manufacturing a semiconductor device according to claim 13, further including at least one compound selected from the group consisting of compounds represented by the general formulas (I) to (V) as a fourth component:

$$R^1\text{—}SO_3X \qquad (I)$$

wherein in the general formula, $R^1$ represents an alkyl group, an alkenyl group, a cycloalkyl group, an aryl group, or an aralkyl group, all of which have a carbon number of 6 to 30, and groups formed by combining 2 or more of these groups; and X represents a hydrogen atom, lithium, sodium, potassium, an ammonium cation, or a quaternary ammonium cation:

$$R^1\text{—O—}SO_3X \qquad (II)$$

wherein in the general formula (II), $R^1$ has the same meaning as in the general formula (I); X represents a hydrogen atom, sodium, potassium, an ammonium cation, a quaternary ammonium cation, diethanolamine, or triethanolamine;

$$R^2\text{—O—}(CH_2CH_2O)_n\text{—}SO_3X \qquad (III)$$

wherein in the general formula (III), $R^2$ represents an alkyl group, an alkenyl group, a cycloalkyl group, an aryl group, or an aralkyl group, all of which have a carbon number of 6 to 30, or groups formed by combining 2 or more of these groups; n represents an integer of 1 to 10; and X has the same meaning as in the general formula (II);

GENERAL FORMULA (IV)

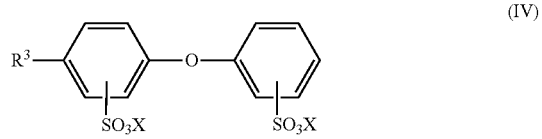

wherein in the general formula (IV), $R^3$ represents an alkyl group, an alkenyl group, a cycloalkyl group, an aryl group, or an aralkyl group, all of which have a carbon number of 6 to 30, or groups formed by combining 2 or more of these groups; X has the same meaning as in the general formula (II), and a plurality of Xs may be mutually the same or different;

GENERAL FORMULA (V)

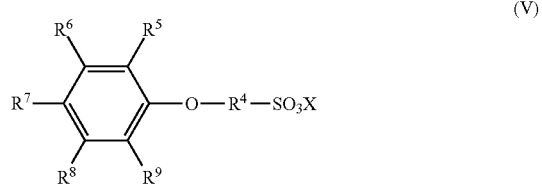

wherein in the general formula (V), $R^4$ represents an alkylene group, an alkynylene group, a cycloalkylene group, an arylene group, or an alkylene oxide group, all of which have a carbon number of 1 to 20, or groups formed by combining 2 or more of the these groups; $R^5$ to $R^9$ independently represent any of a hydrogen atom, a hydroxyl group, an alkyl group, an alkenyl group, a cycloalkyl group, an aryl group, an aralkyl group, a sulfo group, or a carboxyl group, all of which have a carbon number of 1 to 30, and hydrocarbon groups including the above; and X has the same meaning as in the general formula (II).

15. The polishing fluid according to claim 1, further comprising a pH adjuster.

* * * * *